(12) United States Patent
Markovich et al.

(10) Patent No.: US 8,558,374 B2
(45) Date of Patent: Oct. 15, 2013

(54) ELECTRONIC PACKAGE WITH THERMAL INTERPOSER AND METHOD OF MAKING SAME (75) Inventors: Voya R. Markovich, Endwell, NY (US); Rabindra N. Das, Vestal, NY (US); Frank D. Egitto, Binghamton, NY (US); James J. McNamara, Jr., Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 144 days.

(21) Appl. No.: 13/022,654

(22) Filed: Feb. 8, 2011

(65) Prior Publication Data

US 2012/0201006 A1    Aug. 9, 2012

(51) Int. Cl.
*H01L 23/34* (2006.01)
*H01L 21/00* (2006.01)

(52) U.S. Cl.
USPC ........... 257/714; 257/712; 257/713; 257/725; 438/109; 438/122

(58) Field of Classification Search
USPC ........... 257/712, 713, 714, 725; 438/109, 122
See application file for complete search history.

(56) References Cited

U.S. PATENT DOCUMENTS

| | | | |
|---|---|---|---|
| 5,387,815 A | 2/1995 | Nishiguchi | |
| 5,396,403 A | 3/1995 | Patel | |
| 5,468,681 A * | 11/1995 | Pasch | 438/108 |
| 5,585,671 A | 12/1996 | Nagesh et al. | |
| 5,621,615 A | 4/1997 | Dawson | |
| 5,710,459 A | 1/1998 | Teng et al. | |
| 5,757,620 A | 5/1998 | Edwards et al. | |
| 5,759,047 A | 6/1998 | Brodsky et al. | |
| 5,821,161 A | 10/1998 | Covell, II et al. | |
| 5,825,087 A | 10/1998 | Iruvanti et al. | |
| 5,881,945 A | 3/1999 | Edwards et al. | |
| 5,938,454 A | 8/1999 | Brodsky et al. | |
| 5,990,418 A | 11/1999 | Bivona et al. | |
| 6,091,603 A | 7/2000 | Daves et al. | |
| 6,137,164 A * | 10/2000 | Yew et al. | 257/686 |
| 6,218,730 B1 | 4/2001 | Toy et al. | |
| 6,292,369 B1 | 9/2001 | Daves et al. | |
| 6,294,408 B1 | 9/2001 | Edwards et al. | |
| 6,407,924 B1 | 6/2002 | Brodsky | |
| 6,490,161 B1 * | 12/2002 | Johnson | 361/704 |
| 6,493,240 B2 | 12/2002 | Broglia et al. | |
| 6,516,513 B2 | 2/2003 | Milkovich et al. | |
| 7,326,643 B2 | 2/2008 | Desai et al. | |
| 7,511,518 B2 | 3/2009 | Egitto et al. | |
| 7,629,684 B2 | 12/2009 | Alcoe et al. | |

\* cited by examiner

*Primary Examiner* — Jarrett Stark
*Assistant Examiner* — Nicholas Tobergte
(74) *Attorney, Agent, or Firm* — Mark Levy; Hinman, Howard & Kattell, LLP (57) ABSTRACT

An electronic package with two circuitized substrates which sandwich an interposer therebetween, the interposer electrically interconnecting the substrates while including at least one electrical component (e.g., a power module) substantially therein to provide even further operational capabilities for the resulting package.

22 Claims, 3 Drawing Sheets

ELECTRONIC PACKAGE WITH THERMAL INTERPOSER AND METHOD OF MAKING SAME

FIELD OF THE INVENTION

The invention relates to electronic packages and, more particularly, to packages that utilize interposers as part thereof, especially to packages wherein the interposer provides thermal relief during package operation.

BACKGROUND OF THE INVENTION

Electronic packages typically include one or more electrical components, e.g., semiconductor chips, and thus demand that damaging heat from the components be effectively removed and passed to the package's external environment. The ability of a package to dissipate heat generated by its components is generally a function of the quality of the primary heat dissipation path from the component(s) to the external surface of the package. As is well known, failure to provide an effective path for such heat escape may result in destruction of the component(s) or, at a minimum, may significantly reduce the operational capabilities thereof.

In some known package designs, thermal paste or some other thermally conductive material is used as a type of interposer at a point in the primary heat dissipation path from the chip(s) to the package's external surface. Such paste is normally compliant in nature, thus presenting advantageous features. Some of these advantages include the ability to accommodate statistical variations in thickness of the chip(s) to be housed in the package, height of the chip's solder connections (in the case of the more advantageous "flip chip" packaging), cavity depth of the cooling structure, thickness of the seal between the cooling structure, if bonded onto the package substrate, substrate camber, etc. The ability to control variations in the dimensions of such components is difficult, especially where the components are provided from different sources (vendors) or where reworking or modification of such components is required. This problem is especially apparent where large scale commercial production is involved.

With respect to such heat dissipation paths, including those which utilize compliant pastes or the like, the interposer or like component which forms the path from the chip(s) to the underside of the cooling structure may form the "weakest link" in the heat dissipation path; that is, interposers that use pastes or other materials may possess a lower thermal conductivity than do other components of the heat dissipation path. It is essential, therefore, that any interfacing structure between chip and the cooling structure possess effective thermal conductivity, to thereby assure optimal heat escape for the sensitive chip.

Various examples of electronic packages, including those having interposers, are described in the following patents. The listing thereof is not an admission that any are prior art to the presently claimed invention nor that an exhaustive search has been completed.

In U.S. Pat. No. 5,387,815, issued Feb. 7, 1995 to Nishiguchi, entitled SEMICONDUCTOR CHIP MODULE, there is described a semiconductor chip module which includes a substrate on which a wiring portion is formed, a semiconductor chip mounted so as to face a circuit side down to the wiring portion, a heat sink with one end in contact with a side opposite to the circuit side of the semiconductor chip, and a cap enclosing the semiconductor chip and having an opening exposing externally the other end of the heat sink. A metal film is formed at least on the inner wall of the opening and on the surface of the heatsink which is inserted into the cap. An adhesive material is filled between the tip portion of the heat sink and the semiconductor chip, while an adhesive material is filled between the metal films.

In U.S. Pat. No. 5,396,403, issued Mar. 7, 1995 to Patel, entitled HEAT SINK ASSEMBLY WITH THERMALLY-CONDUCTIVE PLATE FOR A PLURALITY OF INTEGRATED CIRCUITS ON A SUBSTRATE, there is described a heat sink assembly for a multi-chip module. A thermally conductive plate is bonded to the chips using indium solder. The plate in turn is thermally coupled to a heat sink (cooling) structure (e.g., comprised of finned aluminum) by thermal paste. The plate is made of a material such as silicon carbide or copper-tungsten alloy having a relatively low coefficient of expansion to minimize mechanical stress resulting from lateral motion of the chips due to thermal expansion. Relatively low-power chips may be thermally coupled to the plate by thermal paste instead of being bonded by solder.

In U.S. Pat. No. 5,585,671, issued Dec. 17, 1996 to Nagesh, et al., entitled RELIABLE LOW THERMAL RESISTANCE PACKAGE FOR HIGH POWER FLIP CLIP ICS, there is described a "flip chip" package with a thermally-conductive lid attached to a backside of the chip by a die attach layer of a predetermined thickness range. A rim is formed on the lid with a depth less than a sum of a thickness of the chip, the interconnect elements, and a minimum final thickness of the die attach layer by a predetermined margin. An initial thickness of thermally-filled epoxy is applied to the backside of the chip and a layer of lid attach epoxy is applied to the rim of the lid in a thickness sufficient to span the predetermined margin. The lid is floated on the die attach layer with the rim of the lid surrounding the chip and floating on the lid attach material. The lid is clamped against the chip with a force sufficient to compress the die attach material to a predetermined thickness in a range less than the initial thickness and not less than the minimum final thickness. An oxide layer, such as an iron or iron-alloy oxide layer, is formed on the bottom surface of the rim. A spacer is placed on the backside of the chip within the die attach material, to define the minimum final thickness of the die attach layer. A beveled or stepped vent hole is formed in the lid and plugged and sealed.

In U.S. Pat. No. 5,621,615, issued Apr. 15, 1997 to Dawson, et al., entitled LOW COST, HIGH THERMAL PERFORMANCE PACKAGE FOR FLIP CHIPS WITH LOW MECHANICAL STRESS ON CHIP, there is described a "flip chip" package comprised of a substrate, a ring structure attached to the substrate, a heat removal structure, and a chip thermally coupled to the heat removal structure. The package lid is comprised of a ring structure and a heat removal structure. The ring structure and heat removal structure are separated until after attachment of the ring structure to the substrate allowing the ring structure to be brazed to the substrate. Brazing the ring structure to the substrate decreases the mechanical stress to the chip. A die attach material between the first major surface of the die and the first major surface of the heat removal structure adheres the die to and thermally couples the die to the heat removal structure. The die attach layer is of a predetermined thickness and thus provides a determined low thermal resistance making the thermal performance of the package certain.

In U.S. Pat. No. 5,710,459, issued Jan. 20, 1998 to Teng, et al., entitled INTEGRATED CIRCUIT PACKAGE PROVIDED WITH MULTIPLE HEAT-CONDUCTING PATHS FOR ENHANCING HEAT DISSIPATION AND WRAPPING AROUND CAP FOR IMPROVING INTEGRITY AND RELIABILITY, there is described an electronic package which includes a chip cap for covering and protecting an integrated chip therein. The chip cap further forms a concave step near a lower edge of the cap for wrapping around the edge of the package's adapter board for increasing the contact areas between the cap and the board and for attaching the cap to the board. The chip cap is composed of thermal conductive materials and the chip cap further includes a heat sink for dissipating heat generated from the chip. The adapter board further includes a plurality of connecting vias and a plurality of conductive metal balls forming a ball grid array (BGA) underneath the adapter board. The chip is in electrical and thermal contact with the BGA by filling the connection vias with conductive materials. A printed circuit board (PCB) is used for supporting and receiving the adapter board thereon. The PCB includes a plurality of thermal vias penetrating there-through and filled with thermal conductive materials, wherein the thermal vias corresponding to and in contact with a plurality of the conductive metal balls of the BGA are used for dissipating heat generated from the chip.

In U.S. Pat. No. 5,757,620, issued May 26, 1998 to Edwards, et al., entitled APPARATUS FOR COOLING OF CHIPS USING BLIND HOLES WITH CUSTOMIZED DEPTH, there is described an apparatus and a method that provides customized cooling of a MCM (Multi-Chip Module) by varying the depth of a thermal compound-filled gap or blind hole above each chip in the module.

In U.S. Pat. No. 5,759,047, issued Jun. 2, 1998 to Brodsky, et al., entitled FLEXIBLE CIRCUITIZED INTERPOSER WITH APERTURED MEMBER AND METHOD FOR MAKING SAME, there is described a flexible circuitized interposer and method of making same wherein the interposer includes at least one flexible circuitized substrate having a dielectric (e.g., polyimide) layer with a conductor and plated elements, e.g., copper pad, including possibly with dendrites thereon for enhanced connection, an apertured support member aligning with the conductor, and a support member having the apertured member thereon. When the interposer is engaged, the flexible circuitized substrate is depressed within the aperture. Various alternatives, including a support formed with compressible portions that extend into respective apertures in the support member, and an interim, compressible support, are disclosed. The support member may also be metallic, e.g., for use as an electrical ground shield. Flexure is also enhanced by utilization of patterns of one or more apertures in the flexible substrate relative to and substantially surrounding the positioned conductors.

In U.S. Pat. No. 5,821,161, issued Oct. 13, 1998 to Covell, II, et al., entitled CAST METAL SEAL FOR SEMICONDUCTOR SUBSTRATES AND PROCESS THEREOF THERE, there is described a structure and a method that uses a multi-layer metallic seal to provide protection to chips on a chip carrier. This multi-layer metal seal is a two layer, solder structure which is used to create a low cost, high reliability, hermetic seal for the module. This solder structure has a thick high melting point temperature region that is attached to a cap, and a thin interconnecting region of lower melting point temperature region for sealing the substrate to the cap.

In U.S. Pat. No. 5,825,087, issued Oct. 20, 1998 to Iruvanti, et al., entitled INTEGRAL MESH FLAT PLATE COOLING MODULE, there is described an electronic module with integrated circuit chips mounted on a substrate and having a specially designed cooling plate overlying the chips and producing a gap above same in which a thermal paste or thermal adhesive is positioned. The cooling plate has a roughened area made by grit blasting and the like which penetrates the thermal paste and thermal adhesive and improves the adhesion and inhibits the flow of thermal paste from between the lower surface of the cooling plate and the upper surface of the chip during operation of the electronic module.

In U.S. Pat. No. 5,881,945, issued Mar. 16, 1999 to Edwards, et al., entitled MULTI-LAYER SOLDER SEAL BAND FOR SEMICONDUCTOR SUBSTRATES AND PROCESS, there is described a structure and method that uses a multi-layer metallic seal to provide protection to chips on a chip carrier. This multi-layer metal seal provides both enhanced hermetic lifetime and environmental protection. In one embodiment, the multi-layer metallic seal band is a three layer, solder sandwich structure which is used to create a low cost, high reliability, hermetic seal for the module. This solder sandwich has a high melting temperature thick solder inner core, and lower melting point thin interconnecting solder layers, where the thin interconnecting solder layers may have similar or different melting points.

In U.S. Pat. No. 5,938,454, issued Aug. 17, 1999 to Brodsky, et al., entitled ELECTRICAL CONNECTOR ASSEMBLY FOR CONNECTING FIRST AND SECOND CIRCUITIZED SUBSTRATES, there is described an electrical connector for coupling two circuitized substrates (e.g., a ball grid array module and a printed circuit board) wherein the connector includes a base member fixedly secured (e.g., soldered) to the printed circuit board and having one substrate oriented therein. The connector further includes a 2-part retention member including one part movably oriented in the base and a second part for directly engaging the retained substrate to cause it to move downwardly (and thus in a completely different direction than the direction of rotation of the movable one part within the base) to thereby provide effective connection between substrates. An interposer may be used if desired.

In U.S. Pat. No. 5,990,418, issued Nov. 23, 1999 to Bivona, et al., entitled HERMETIC CBGA/CCGA STRUCTURE WITH THERMAL PASTE COOLING, there is described a device and method for hermetically sealing an integrated circuit (semiconductor) chip between a substrate and a lid while providing dissipation of heat generated by the integrated circuit chip. The device includes an integrated circuit chip, carrier substrate, interface coolant, and a lid. The chip is attached to the top of the carrier substrate. The interface coolant is disposed on the top of the integrated circuit chip and the lid is placed on top of the carrier substrate/integrated circuit chip combination and contacts the interface coolant. The interface coolant provides a thermal path for conducting heat from the integrated circuit chip to the lid.

In U.S. Pat. No. 6,091,603, issued Jul. 18, 2000 to Daves, et al., entitled CUSTOMIZABLE LID FOR IMPROVED THERMAL PERFORMANCE OF MODULES USING FLIP CHIPS, there is described an integrated circuit chip packaging module characterized by a customized lid understructure which enables a reduction in the amount of compliant thermally conductive material in the primary heat dissipation path. The lid structure and module are made by processes wherein the lid understructure is customized for the chip(s) to be housed. The customization is achieved by the use of shims and a deformable lid understructure.

In U.S. Pat. No. 6,218,730, issued Apr. 17, 2001 to Toy, et al., entitled APPARATUS FOR CONTROLLING THERMAL INTERFACE GAP DISTANCE, tolerances in chip, substrate and hardware dimensions are accommodated by means of a floating sealing structure to insure that compliant thermally conductive paste disposed between the chip and its lid is as trim as possible in order to reduce thermal resistance of the paste so as to be able to run the chip at a cooler temperature. Standoffs are also preferably employed to insure proper paste gap thickness.

In U.S. Pat. No. 6,292,369, issued Sep. 18, 2001 to Daves, et al., entitled METHODS FOR CUSTOMIZING LID FOR IMPROVED THERMAL PERFORMANCE OF MODULES USING FLIP CHIPS, there is described an integrated circuit chip package including a customized lid understructure which enables a reduction in the amount of compliant thermally conductive material in the primary heat dissipation path. The lid structure and package are made by processes wherein the lid understructure is customized for the chip(s) to be housed. The customization is achieved by the use of shims and a deformable lid understructure.

In U.S. Pat. No. 6,294,408, issued Sep. 25, 2001 to Edwards, et al., entitled METHOD FOR CONTROLLING THERMAL INTERFACE GAP DISTANCE, there is described an electronic chip assembly which maintains a thin gap spacing between the chip and the lid or heat sink to allow the electronic chip to operate at a relatively cool temperature. Thermal performance is allegedly enhanced by a thermal interface material provided in the thin gap and maintained at a minimal thickness as a result of the structure and assembly process. A thin thermal interface material layer may be achieved with a compression step to compress the thermal interface material before the sealant is cured. In addition, a vent hole is provided in the assembly to prevent pressure build-up inside the package during sealant cure. As the sealant is cured, the gap spacing is maintained, further compression of the thermal interface material is not required, and seal defects are allegedly prevented.

In U.S. Pat. No. 6,407,924, ISSUED Jun. 18, 2002 to Brodsky, entitled ENHANCED THERMAL PATH MECHANICAL TOLERANCE SYSTEM, there is described a method and structure for interfacing a thermally conductive pad between a heat generating module and a heat-sink, such that the pad is in substantial thermal contact with both the module and the heat-sink despite the fact that both the module and the heat-sink are under mechanical tension. The mechanical tension causes deflection of a surface of the module and a surface of the heat-sink so as to generate an air gap between the pad and the heat-sink, as well as between the pad and the module. The present invention overcomes the deflection by crowning the pad, crowning the heatsink, or crowning the module.

In U.S. Pat. No. 6,493,240, issued Dec. 10, 2002 to Broglia, et al., entitled INTERPOSER FOR CONNECTING TWO SUBSTRATES AND RESULTING ASSEMBLY, there is described an interposer for electrically coupling a "micro-card" with a mother board (PCB). The interposer includes a frame which is interposed between the micro-card and the motherboard, electrically connecting the micro-card and the motherboard by means of plated via-holes. The substrate is organic and a plurality of chips is mounted on both sides of the substrate. On the opposite sides of the interposer are pluralities of metal pads which are coupled by metallized via holes, the pads in turn connected to the chips, thereby coupling chips or cards on one side of the interposer to chips or boards on the other side. Electrical connection between the chips on the top side of the substrate and the metal pads on the lower side of the substrate is provided by the metallized via holes.

In U.S. Pat. No. 6,516,513, issued Feb. 11, 2003 to Milkovich, et al., entitled METHOD OF MAKING A CTE COMPENSATED CHIP INTERPOSER, there is described a multilayer CTE compensated chip interposer for connecting a semiconductor chip to a laminate chip carrier. A first dielectric layer, on the chip side of the interposer, is made of a stiff, high elastic modulus, material, such as a ceramic material, with a CTE closely matching the CTE of the chip. A second dielectric layer, on the laminate chip carrier side of the interposer, is made of resilient, low elastic modulus, material with metallurgy formed thereon, such as circuit board material, with a composite CTE closely matching the CTE of said chip carrier. A third dielectric intermediate layer, laminated between said first and second layers, is made of a low elastic modulus material with metallurgy formed thereon, such as a Teflon/glass particle material, with a composite CTE between the CTEs of said first and second layers.

In U.S. Pat. No. 7,326,643, issued Feb. 5, 2008 to Desai, et al., entitled METHOD OF MAKING CIRCUITIZED SUBSTRATE WITH INTERNAL ORGANIC MEMORY DEVICE, there is described a method of making a circuitized substrate comprised of at least one dielectric material having an electrically conductive pattern thereon. At least part of the pattern is used as the first layer of an organic memory device which further includes at least a second dielectric layer over the pattern and a second pattern aligned with respect to the lower part for achieving several points of contact to thus form the device. The organic memory device is thus embedded within and part of the circuitized substrate.

In U.S. Pat. No. 7,511,518, issued Mar. 31, 2009 to Egitto, et al., entitled METHOD OF MAKING AN INTERPOSER, there is described an interposer in which at least two dielectric layers are bonded to each other to sandwich a plurality of conductors there-between. The conductors each electrically couple a respective pair of opposed electrical contacts which are formed within and protrude from openings which are also formed within the dielectric layers. The contacts may have sculpted, grooved or the like configurations, which in turn may mate with and partially penetrate solder elements, e.g., solder balls. The resulting interposer is ideally suited for use as part of a test apparatus to interconnect highly dense patterns of solder ball contacts of a semiconductor chip to lesser dense arrays of contacts on the apparatus's printed circuit board.

In U.S. Pat. No. 7,629,684, issued Dec. 8, 2009 to Alcoe, et al., entitled ADJUSTABLE THICKNESS THERMAL INTERPOSER AND ELECTRONIC PACKAGE UTILIZING SAME, there is described an electronic package which includes a substrate (e.g., a chip carrier or PCB), an electronic component (e.g., a semiconductor chip), a heat-sink and a thermal interposer for effectively transferring heat from the chip to the heat-sink. The interposer includes a compressible, resilient member (e.g., an elastomeric pad) and a plurality of thin, metallic sheets (e.g., copper foils) and the thickness thereof can be adjusted by altering the number of such foils.

The present invention defines an electronic package including at least two circuitized substrates and an interposer structure capable of providing effective heat transference from at least one electrical component positioned substantially within the interposer. The package defined herein is able to provide many advantages through the effective heat transference of the internally positioned component, thereby further enhancing the operational capabilities of the final package. It is believed that such a package, as well as a method of making same, would represent significant advancements in the art.

SUMMARY OF THE INVENTION

It is, therefore, an object of the invention to enhance the art of electronic packages by providing a package with effective thermal escape (transfer) from the electronic component(s) which form part of the package.

It is a more specific object of the invention to provide an electronic package with a thermal interposer that provides an excellent heat path for heat generated from the electronic component(s) to the package's exterior.

It is yet another object of the invention to provide a method of making an electronic package which can be manufactured efficiently and on a large scale.

It is still another object of the invention to assure acceptable tolerance ranges during the assembly of such electronic packages while assuring a highly efficient path of heat dissipation therefor.

According to one aspect of the invention, there is provided an electronic package comprising a first circuitized substrate including an upper surface including a circuit thereon having a plurality of electrical conductors, a second circuitized substrate including a lower surface having a circuit thereon including a plurality of electrical conductors, an interposer positioned substantially between the first and second circuitized substrates, this interposer electrically interconnecting selected ones of the electrical conductors of the circuits on the two circuitized substrates, and at least one electrical component positioned substantially within the interposer. Heat dissipation means is positioned relative to the at least one electrical component for transferring heat generated by the electrical component externally of the electronic package.

According to another aspect of the invention, there is provided a method of making the aforementioned electronic package.

BRIEF DESCRIPTION OF THE DRAWINGS

A complete understanding of the present invention may be obtained by reference to the accompanying drawings, when considered in conjunction with the subsequent, detailed description, in which.

DETAILED DESCRIPTION OF THE PREFERRED EMBODIMENT

For a better understanding of the present invention, together with other and further objects, advantages and capabilities thereof, reference is made to the following disclosure and appended claims in connection with the above-described drawings. It is understood that like numerals will be used to indicate like elements from drawing figure to drawing figure.
Definitions The following terms will be used herein and are understood to have the meanings associated therewith.

By the term "circuit" as used herein is meant a pattern of electrical conductors, selected ones of these electrical conductors being electrically interconnected by circuit lines (also referred to in the industry as "traces"). Typically, such circuits are comprised of copper or copper alloys, but this invention is not limited to these materials.

By the term "circuitized substrate" as used herein is meant to define a structure including at least one dielectric layer having at least one surface having thereon at least one circuit. Examples of dielectric materials suitable for use in such structures include fiberglass-reinforced or non-reinforced epoxy resins (sometimes referred to simply as FR4 material, meaning its Flame Retardant rating), poly-tetrafluoroethylene (Teflon), polyimides, polyamides, cyanate resins, photoimagable materials, and other like materials, or combinations thereof. Examples of electrically conductive materials for the circuit layers include copper or copper alloy. If the dielectric is a photoimagable material, it is photoimaged or photopatterned, and developed to reveal the desired circuit pattern, including the desired opening(s) as defined herein, if required. The dielectric material may be curtain coated or screen applied, or it may be supplied as a dry film or in other sheet form.

By the term "electronic package" as used herein is meant to include at least one and possibly more such circuitized substrates (in the case of the present invention, at least two are used).

By the term "electrical component" as used herein is meant components such as semiconductor chips, modules, resistors, capacitors and the like, which are typically adapted for being positioned on and electrically coupled to the external conductors of the circuits of such substrates, and electrically coupled to other components (if utilized). The circuitized substrates taught herein are readily adaptable for having one or more such electrical components positioned thereon and electrically coupled thereto.

By the term "high density" as used herein to define the pattern of electrical conductors of the substrate and electronic device circuitry is meant a pattern wherein the conductors each possess a maximum width within the range of from only about 0.2 mils to about 1.0 mil and are spaced apart from each other (at the nearest point of edges of adjacent conductor features) within the range of only about 0.2 mils to about 1.0 mil (as defined herein, a mil is equal to 0.001 inch).

By the term "high speed" as used herein to define the substrate signal speed capabilities is understood to mean signals within a frequency range of from about 3.0 to about 10.0 Gigabits Per Second (GPS) and possibly even faster. The circuitized substrates of the instant invention are capable of operating at such high frequencies if desired.

By the term "information handling system" as used herein is meant to define any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include electronic packages including PCBs and chip carriers and other forms of circuitized substrates as part thereof, some including several such packages depending on the operational requirements thereof.

By the term "interposer" as used herein is meant to include a structure capable of electrically interconnecting arrays of electrical conductors on two opposing circuitized substrates. Such an interposer, as defined herein, may include at least one dielectric layer (and possibly more) and connecting structure (e.g., spring connectors) positioned therein for connecting respective pairs of conductors of the opposing substrates. As defined herein, the interposer may further include at least two external conductive circuit layers and possibly one or more internal conductive circuit layers. Examples of dielectric materials include such materials as fiberglass-reinforced epoxy resins (some referred to as FR4 dielectric materials in the art), such reinforced resins having inorganic particles (e.g., silica) therein as well as epoxy resins including inorganic particles (e.g., silica) for the purpose of controlling the coefficient of thermal expansion (CTE) of the dielectric material, polytetrafluoroethylene (e.g., Teflon), including poytetrafluoroethylene filled with inorganic particles (e.g., silica) as a means of controlling the coefficient of thermal expansion of the dielectric material, polyimides (e.g., Kapton), fiberglass-reinforced polyimides, polyamides, cyanate resins, polyphenylene ether resins, fiberglass-reinforced polyphenylene ether resins, fiberglass-reinforced polyphenylene ether resins filled with inorganic particles (e.g., silica), aramid fiber-reinforced resins, liquid crystal polymers, photo-imagable materials, and other like materials. If the dielectric material for the interposer is of photo-imagable material, this material may be photo-imaged (or photo-patterned), and developed to reveal the desired pattern of openings. The dielectric material may be curtain-coated, spin-coated or screen-applied, or it may be supplied as dry film.

By the term "Kapton" as used herein is meant a polyimide material currently available from E.I. duPont deNemours & Company (duPont) of Wilmington, Del., and sold under this product name.

By the term "module" as used herein to define an electrical component is meant a component having a substrate (e.g., a small PCB, or ceramic member) on which is positioned at least one semiconductor device, the module possibly further including a plurality of conductive leads adapted for coupling the device to electrical circuitry and/or electrical components located externally of the module. One known example of such a module is a Multi-Chip Module (MCM), such modules coming in a variety of forms depending on the complexity and development philosophies of their designers. These can range from pre-packaged chips on a small PCB (to mimic the package footprint of an existing chip package) to fully custom chip packages integrating many chips on a High Density Interconnection (HDI) substrate. A relatively new development in MCM technology is the so-called "chip-stack" package. Certain chips, memory chips in particular, have very similar or identical pin-outs when used multiple times within systems. A carefully designed substrate can allow these dies to be stacked in a vertical configuration making the resultant MCM's footprint much smaller (albeit at the cost of a thicker or taller chip). Since area is more often at a premium in miniature electronics designs, the chip-stack is an attractive option in many applications such as cell phones and personal digital assistants.

By the term "Teflon" as used herein is meant a polytetrafluoroethylene material currently available from duPont and sold under this product name.

By the term "thin" as used herein to define a dielectric layer for use in the interposer of the invention is meant a thickness within the range of from only about 0.5 mils to about three mils, a mil understood to be equal to 0.001 inch.

By the term "thru-hole" as used herein to define an electrically conductive structure formed within a circuitized substrate as defined herein and is meant to include three different types of electrically conductive elements. It is known in multilayered PCB's and chip carriers to provide various conductive interconnections between various conductive layers of the PCB and carrier. For some applications, it is desired that electrical connection be made with almost if not all of the conductive layers. In such a case, thru-holes are typically provided through the entire thickness of the board, in which case these are often also referred to as "plated thru holes" or PTHS. For other applications, it is often desired to also provide electrical connection between the circuitry on one face of the substrate to a depth of only one or more of the inner circuit layers. These are referred to as "blind vias", which pass only part way through (into) the substrate. In still another case, such multilayered substrates often require internal connections ("vias") which are located entirely within the substrate and covered by external layering, including both dielectric and conductive. Such internal "vias", also referred to as "buried vias", may be formed within a first circuitized substrate which is then bonded to other substrates and/or dielectric and/or conductive layers to form the final, multilayered embodiment. Therefore, for purposes of this application, the term "thru hole" is meant to include all three types of such electrically conductive openings.

As defined herein and also understood from the description, this invention possesses many advantageous features which are considered highly desirable in the electronic packaging industry. Among these include a small, compact design which maximizes space, assures effective heat removal, and is also able to assure maximum capacity, including the provision of enabling high speed signal passage there-through. Because an interposer is used which forms a separable connection between two circuitized substrates, package re-work is readily possible, if needed, without significant expenditure, thereby facilitating the removal and replacement of defective parts, including semiconductor devices. The resulting package design as taught herein is of relatively stiff design, possibly eliminating the need for an additional stiffener or the like as required in many known packages. The design also serves to reduce destructive stresses which may build up during package operation, thereby also substantially preventing highly undesirable warping. Significantly, the construction is of relatively simple design to thereby reduce manufacturing costs. Still further, the package is adaptable to using a variety of electrical components, including of course, semiconductor chips, but also embedded resistors and capacitors. Even further, the resulting package possesses enhanced operational capabilities compared to many such packages of the prior art due to the use of one or more electrical components positioned substantially within the interposer, which component itself may be electrically coupled to circuitry and/or components located externally of the package. Other features are discernible from the following description and reference to the provided drawing figures.

Figure 1:
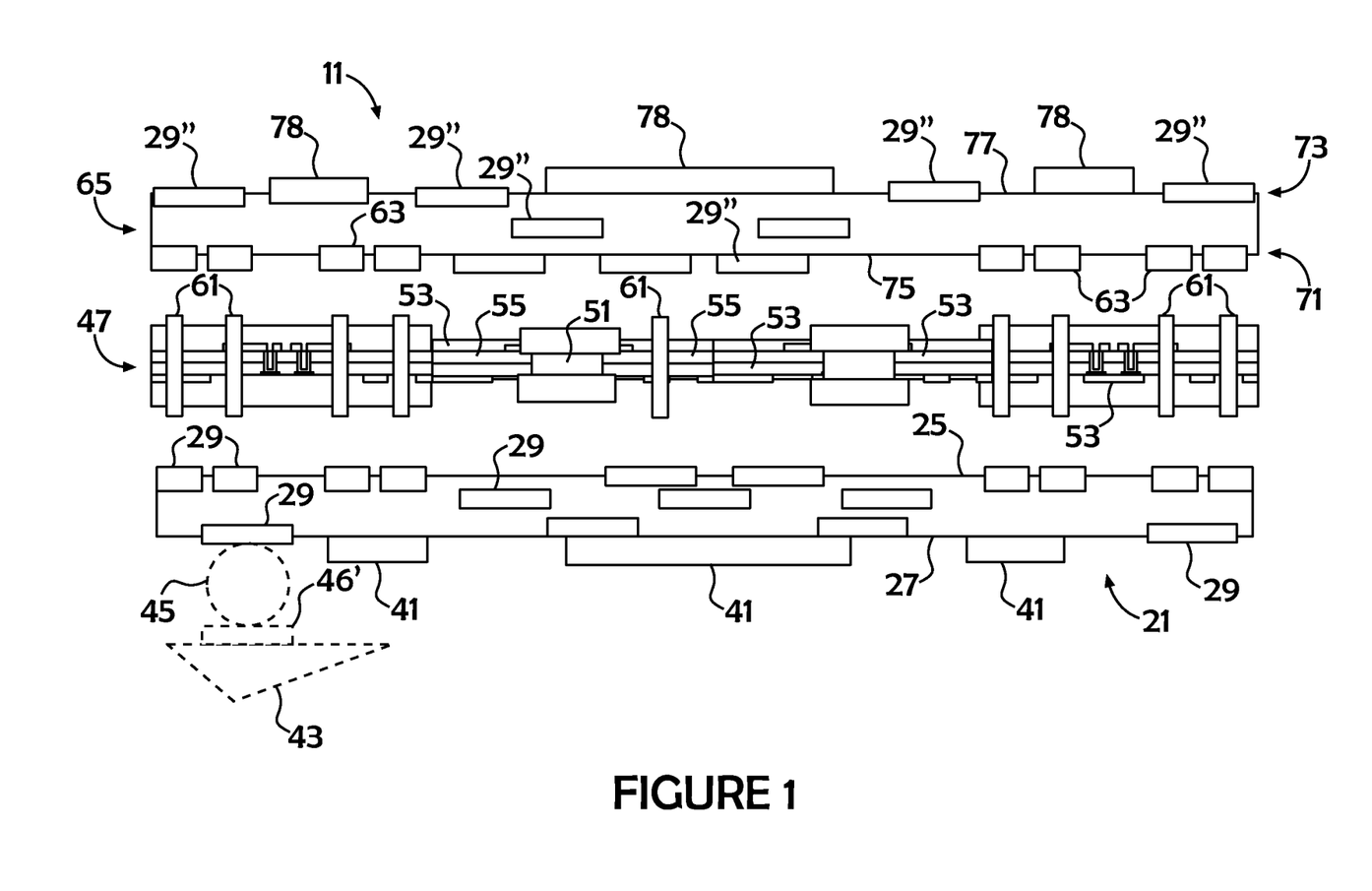
FIG. 1 is an enlarged side view, partly in section, showing an electronic package according to one embodiment of the invention.

In FIG. 1, there is illustrated an electronic package 11 according to one aspect of this invention. Package 11 includes a first circuitized substrate 21 in turn including at least one thin dielectric layer 23 having first and second (upper and lower) surfaces 25 and 27. In the FIG. 1 embodiment, substrate 21 includes more than one thin dielectric layer and further includes individual circuit patterns (three patterns in this case, an electrically conductive element or conductor 29 of each being shown for illustration purposes).

The conductors 29 may comprise individual pads, as shown, which in turn may be electrically coupled by conductive lines or traces. The dielectric layers may comprise one of the above defined dielectric materials, depending on final product application requirements (e.g., electrical, mechanical, and thermal). The most commonly used materials include the afore-defined epoxy-based dielectrics, and for even higher performance applications, the afore-defined PTFE-based dielectrics, LCP, or dielectric materials formed from polyphenylene ether resins. Any internal circuit patterns as defined above are formed prior to lamination of the individual dielectric layers, each dielectric layer having such a pattern thereon with other such layer-circuit pattern structures then bonded together to form the multilayered substrate. Such circuit patterns, including the pads and any desired connecting lines or traces (not shown in FIG. 1), are preferably of copper or copper alloy and are formed on the respective dielectric layer using conventional photolithographic processing known in the substrate art. This (formation process, materials) is also true for the external patterns in FIG. 1, further described below.

Two of the described circuit patterns of electrical conductors of substrate 21 are external circuit patterns 31 and 33 and are located on the first and second (upper and lower) opposing surfaces 25 and 27 of the substrate, respectively. The lower pattern 33 of conductors 29 is adapted to have at least one (three shown in FIG. 1) electrical component: a semiconductor chip 41, coupled thereto when the component is mounted on surface 27.

In the FIG. 1 embodiment, pattern 33 includes conductors positioned in at least two different density patterns. Specifically, those conductors intended to be coupled to corresponding conductors on a chip 41 are of a high density (defined above) pattern, while those positioned on surface 27 externally of the chip conductors are of a lesser density, spaced greater distances apart and possibly of larger configuration.

Figure 3:
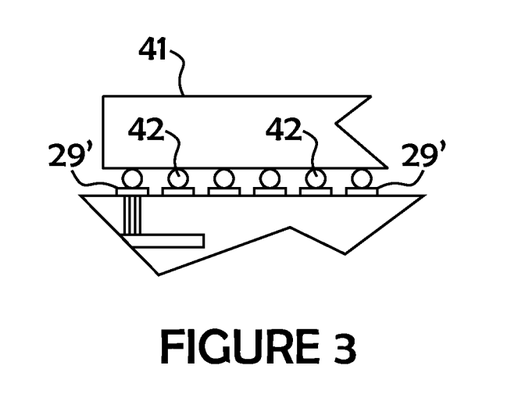
FIG. 3 is a partial side view, also of a much enlarged scale, showing one embodiment of the positioning of an electrical component on a circuitized substrate (or interposer) of the invention and the coupling of this component to a selected conductor of the substrate (or interposer)

Only the lesser density conductors 29 are shown in FIG. 1, while the higher density pattern of conductors (represented by the numerals 29'), designed to be coupled to a component such as a chip, are shown in FIG. 3, where solder elements 42 are used as the coupling medium. Use of solder balls is the preferred means of coupling the various components to the respective conductors of this invention. The solder balls may be of conventional composition (e.g., of one tin-lead (by weight) composition (e.g., 63:37)), while those used to couple substrate 21 to host substrate 43 is of a different tin-lead composition (e.g., 10:90), so as to afford different melting points during package assembly. Many different combinations are possible and the invention is not limited to these particular compositions. Lead-free solders (e.g., tin-gold-copper alloy) may also be utilized.

Other forms of electrical connection may be utilized in this invention to couple one or more of the electrical components to respective conductors of the hosting substrate. For example, a solder ball or similarly rounded solder element may align with and be connected to a conductor of sculpted configuration. By the term "sculpted" as used herein is meant a final external configuration of a metallic conductor such as may be formed using differential gray scale etching. Examples of such configurations, and others, are illustrated in the aforementioned U.S. Pat. No. 7,511,518. Many different configurations are of course possible, and this invention is not limited.

By a lesser density when defining the various patterns of electrical conductors used in this invention may mean a maximum conductor width within the range of from only about one mil to about ten mils, with these spaced apart from each other (at the nearest point of edges of adjacent conductor features) within the range of only about one mil to about ten mils. In this embodiment, copper or copper alloy conductors may be used. If added components, such as resistors (not shown) are also to be positioned on and coupled to pattern 33, similar or even different patterns of conductors may be used, depending on the associated density pattern of the respective added component. Pattern 33, therefore, is not limited to the specific density orientations shown herein, but may vary widely depending on the operational requirements for the invention.

Lower pattern 33 is also adapted for being coupled to a larger hosting circuitized substrate such as a PCB 43 (shown in phantom), using solder balls 45 (also shown in phantom). The conductors designed for such PCB coupling may also all be of a lesser density because the corresponding upper pattern of conductors (46') of such larger PCBs are typically of lesser density when designed for this purpose.

Upper pattern 31 of conductors 29 is shown as being of a lesser density than that of the conductors 29' for receiving chips 41, for reasons understood from the following description. This upper pattern is designed only for being electrically coupled to a corresponding pattern of conductors on the invention's upper circuitized substrate, also described in greater detail hereinbelow.

The defined conductor pattern differences represent an important feature of the invention because of the adaptability of the resulting product to meet many stringent packaging requirements of customers. Formation of both patterns 31 and 33 may be accomplished simultaneously, using the aforementioned photolithographic or similar processing, or said patterns may be individually formed.

Selected ones of the conductors 29 of substrate 21 may be interconnected using a variety of different means, including the conventional plated thru hole approach defined above, use of electrically conductive paste within an interconnecting opening, or a combination of the two (paste within a PTH). For example, one or more of the outer conductors of patterns 31 may be directly coupled to a corresponding conductor or conductors of pattern 33 using a PTH, while another outer conductor may be coupled to one of the inner conductors using a "blind via" as defined above. Other means (e.g., "buried vias") known in the art are also possible if the substrate includes two or more internal circuit layers. This invention is not limited to these particular types.

The illustrated substrate 21 may be referred to as a base substrate for electronic package 11, since it hosts one or more electrical components to be retained within the package "body" (defined in greater detail below) and is also adapted for being positioned on the hosting substrate to couple the completed package thereto. The base substrate as formed herein is not coupled to such a hosting PCB until the package has been so completely formed. When so assembled, the package and hosting substrate may form part of an information handling system as defined above.

Package 11 of FIG. 1 further includes an interposer 47 adapted for being positioned on the lower substrate 21 and electrically coupled thereto. Interposer 47 represents a significant aspect of this invention for the reasons explained herein and otherwise discernible from these teachings. In one key aspect, interposer 47 essentially represents a second of three circuitized substrates that form final package 11 of this invention. Significantly, the interposer 47 of this invention is adapted to have one or more electrical components (represented in FIG. 1 by the reference numerals 51) positioned therein.

Figure 4:
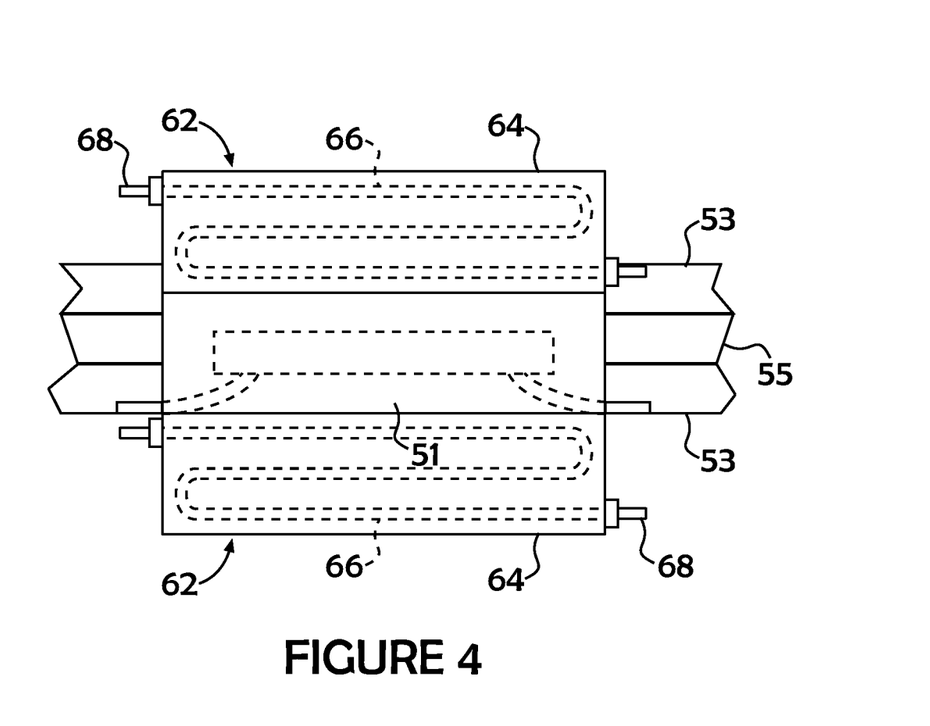
FIG. 4 is a partial side view, also of a much enlarged scale, showing one embodiment of the positioning of a module within the interposer of the invention, and one embodiment of means for cooling the module during package operation.

One example of such a component 51 is a module, as defined above, and seen in better detail in FIG. 4. As seen in FIG. 1, interposer 47 has two such modules retained therein, thereby adding substantially to the processing capabilities of package 11. Other components may also be positioned within interposer 47, as well as thereon, one example being a semiconductor chip 53 which in turn may be electrically coupled to circuitry of the interposer 47. To provide cooling of the heat-generating modules 51 during operation, a pair of cooling members 62 is utilized for each module 51, and positioned on opposite sides thereof as seen in FIG. 1 and better seen in FIG. 4. Each member 62 may include a ceramic body 64 that includes micro-channels 66 therein through which cooling fluid may be passed, when provided (i.e., through piping 68) from a suitable source (not shown) positioned externally of the package. Such cooling fluids are known in the art and further description is not needed. It is also understood that sources for providing such fluid, including pumps or the like, are also known.

It is also possible to use a trench that can be etched at the back side of the chip. The nano tubes or nano belts or nano springs or nano particles with high thermal conductivity are laid down, extending from the power node to other areas of the chip with less power density. The nano tubes filled trench can be connected to the micro channels for better thermal performance.

In FIG. 1, chip 53 is coupled to opposing side circuitry using PTH 55. Other forms of connections, include mounting the chip(s) directly on surface conductors, using solder ball connections, for example. Interposer 47 may include upper and lower circuit patterns of conductors on respective upper and lower surfaces for even more electronic components mounted thereon. It may also include internal components (not shown) such as embedded capacitors or resistors, as part of its make-up, adding even further operational capabilities to this invention. As with substrate 21, the opposing conductors may be interconnected using known means such as PTH and/or paste and/or combinations of the two, as well as using alternative coupling structures. The circuits may be of copper or copper alloy and formed also using conventional photolithographic processing known in the packaging art. The corresponding patterns of conductors may also vary, depending on the corresponding pattern of conductors to which these are to be coupled.

Interposer 47, like substrate 21, further comprises at least one and preferably more dielectric layers 53 and, preferably, a relatively thick internal conductive plane 55. The dielectric layer(s) may be of one of the above described dielectric materials, one desirable such material being Teflon. The layer or layers may also preferably be thin in construction. For added rigidity, it is also possible to use a ceramic material known in the art of electronic packaging. Polymer dielectric materials are preferred, however, for ease of manufacture and because so many have proven very successful in such packaging compared to earlier ceramics. Regardless of material, the interposer as defined herein may further eliminate the need for an added stiffener or the like, as are often required in electronic package structures known today.

Interposer 47 is designed to be connected to substrate 21 and the upper substrate, described below in a separable manner, which is considered highly advantageous to enable repair and/or replacement of selected parts of package 11 which might become defective or damaged. The preferred means of providing such connection is a plurality of spacedly positioned springs 61 (see especially the enlarged partial view of FIG. 2). In FIG. 1, a total of nine such springs are used, although this number may vary depending on package dimensions and other design factors. Each spring is preferably a Z-shaped spring comprising copper or copper alloy (e.g., beryllium-copper) and includes opposing flat ends which mate with and engage respective conductors 29 of substrate 21, and conductors 63 of an upper circuitized substrate 65, described below. Not all conductors of these two opposing substrates are engaged, since some, as understood from above, are intended for other purposes, such as to have components mounted thereon. The invention is not limited to using Z-shaped springs and other forms of connectors are possible, including coil springs, electrically conductive foam, telescoping pins, etc. Interposer 47 thus serves to electrically interconnect two opposed substrates at selected locations thereon, in addition to having one or more modules and one or more other components positioned therein.

Package 11, as seen further in FIG. 1, also includes the aforementioned circuitized substrate 65, positioned above the substrate 21-interposer 47 pair, thus serving as both an upper and a cover member. As such, the three structures shown in FIG. 1, when bonded together, form electronic package 11. Substrate 65 is considered a cover substrate because it serves as a cover for package 11 to cover and protect both the interposer 61 and, importantly, the components and circuitry of base substrate 21 located within and upon interposer 47. Therefore, substrate 65, in combination with base substrate 21, protects these enclosed elements from potentially harsh environmental conditions to which the final package may be exposed. As understood, the height of any associated projecting joining members (in this case, the projecting ends of the spring conductors 61, when compressed) must be greater than the height of any component or other circuit feature which might extend above the surface of interposer 47.

Cover circuitized substrate 65 may be similar to corresponding base circuitized substrate 21 in both material and dimensional aspects. That is, it may include one or more thin dielectric layers or one or more internal circuit patterns. Like substrate 21, substrate 65 includes opposing external circuit patterns 71 and 73 on the first and second opposing surfaces 75 and 77, respectively, these patterns also of conventional metallurgy and formed using known photolithographic processing techniques. As with substrate 21, the pattern 73 of conductors is also adapted to have at least one electrical component, such as a semiconductor chip 78 (three shown in FIG. 1) coupled thereto when the component is mounted on surface 77.

In one embodiment, pattern 73, like pattern 33 of substrate 21, includes conductors positioned in at least two different density patterns. Specifically, those conductors intended to be coupled to corresponding conductors on a chip are of a high density pattern, while those (29") positioned on surface 77 externally of the chip conductors may be, and preferably are, of a lesser density.

Reference is again made to the enlarged view of FIG. 3 where examples of such higher density conductors (29') are shown. By a lesser density in this embodiment may mean a maximum width of conductor 29" within the range of from only about one mil to about ten mils, with these spaced apart from each other within the range of only about one mil to about ten mils. In this embodiment, copper or copper alloy conductors may be used. If added components are to be positioned on and coupled to the upper surface 77, similar or even different configuration conductors may be used, depending on the associated density pattern of the respective added component(s). The upper pattern, therefore, is not limited to the specific density orientations shown in the drawings.

Figure 2:
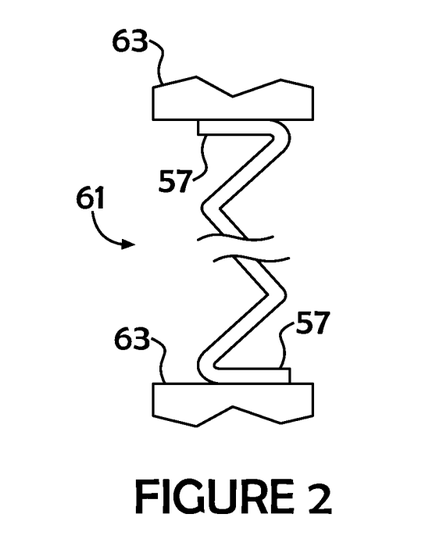
FIG. 2 is a partial side view, of a much enlarged scale over the view of FIG. 1, of one embodiment of an electrically conductive spring member for use in the interposer of the invention.

The lesser density pattern of conductors 29" of lower circuit pattern 71 are in turn adapted for being coupled to corresponding upper conductors 29 of lower substrate 21 using the aforementioned plurality of spacedly positioned springs 61, also shown better in FIG. 2. Thus, both patterns 71 and 31 of the mating pairs are of the same density, which may be different than the density of other conductors on either or both of respective surfaces. These pattern differences represent a further important feature of the invention because of the adaptability of the resulting product to meet many stringent packaging requirements customers. Formation of patterns 71 and 73 may be accomplished simultaneously, using the aforementioned photolithographic or similar processing, or individually.

Conductors 29" of substrate 65 may be connected using different means, including the means depicted in FIG. 1 for conductors 29: plated thru holes (PTH), use of electrically conductive paste within an interconnecting opening, or a combination of the two (paste within a PTH). Other means known in the art are also possible and this invention is not limited to these embodiments. As with substrate 21, and if the substrate has one or more internal circuit patterns, it is also possible to connect selected ones of the upper or lower conductors to one or more of such interim circuits. Many combinations of such connections are well within the scope of this invention.

Surprisingly, the addition of a cover substrate 65 to cover and thereby help to enclose the modules 51 of the interposer 47 still enables sufficient removal of heat generated by the chip during package operation. Such effective heat removal is achieved through the various heat transfer members (i.e., thick copper layer 55) within the interposer body and the cooling structures (i.e., the cooling micro-channeled body 64) thermally positioned relative to the modules 51, in addition to the efficient use of heat transfer structure such a conductors 29 and 29" thermally coupled by such conductive structures as the afore-defined PTH within the substrate bodies. It is also understood that the compressible springs 61 thermally couple both opposing substrates to provide still further heat transfer paths. The invention as defined herein is uniquely able, in a surprising manner, to provide effective heat removal from the package, including from internally positioned heat-generating components, despite the close proximity of such heat-generating components to other parts of the package, as required by its compact design. As mentioned above, effective heat removal is essential for the successful operation of any electronic package.

The three individual structures (base substrate 21, interposer 47 and cover substrate 65) may be bonded together in a single step to form the electronic package 11. Use of high temperature melt (e.g., tin-lead 10:90) solder sphere and low temperature melt (e.g., tin-lead 63:37) solder paste or coating is one of the preferred means of coupling the various structures to the respective conductors of this package. A low temperature reflow profile is used only to melt low temperature melt solder. The high temperature melt solder sphere remains solid and helps to self align all of the structures to bond together in a single step to form electronic package 11. In addition, the three individual structures may be tested prior to joining, improving stacked package yield by selection of only good individual structures, and/or allowing rework. As stated above, when the three individual structures are bonded together to form electronic package 11, the package may now be positioned on and bonded to the larger hosting substrate 43 to become part of an information handling system as defined above. It is also possible to use multiple interposers 47 between base substrate 21 and cover substrate 65. Such interposers 47, substrate 21 and cover substrate 65 may be bonded together in a single step or multiple steps to form electronic package 11.

Furthermore, interposer 47 can have single or multiple openings to accommodate electrical components of base substrate 21 or cover substrate 65 or to accommodate electrical components of both base substrate 21 and cover substrate 65. In addition, base substrate 21 and cover substrate 65 can have openings to accommodate electrical components or thermal components of interposer 47.

As defined, this invention possesses many advantageous features considered highly desirable in the electronic packaging industry. Among these include a compact design which maximizes space in a very small volume structure while uniquely assuring effective heat removal to such an extent that package damage is substantially prevented. This package is also able to allow high speed signal passage therethrough. Because a separable interposer is used, package re-work, if needed, is readily possible without significant expenditure, thereby facilitating the removal and replacement of defective parts, including relatively expensive semiconductor devices. The resulting package design as taught herein is also relatively stiff, possibly eliminating the need for an additional stiffener or the like as required in many known packages. The design also serves to reduce destructive stresses which may build up during package operation, thereby also substantially preventing highly undesirable warping. Still further, the package is adapted for utilizing a variety of electrical components, including of course, semiconductor chips and modules, but also may include embedded resistors and capacitors, thus enabling the resulting package to possess enhanced operational capabilities. Additional features are discernible from the above detailed description and with reference to the corresponding drawing figures.

Since other modifications and changes varied to fit particular operating requirements and environments will be apparent to those skilled in the art, the invention is not considered limited to the example chosen for purposes of this disclosure, and covers all changes and modifications which do not constitute departures from the true spirit and scope of this invention.

Having thus described the invention, what is desired to be protected by Letters Patent is presented in the subsequently appended claims.

What is claimed is:

1. An electronic package comprising: a first circuitized substrate having an upper surface including at least a first electrical component and a first circuit thereon having a plurality of electrical conductors; a second circuitized substrate having a lower surface including at least a second electrical component and having a second circuit thereon including a plurality of electrical conductors; an interposer positioned substantially between said first and second circuitized substrates, said interposer comprising at least one opening to accommodate a first electrical component of at least one of the group: said first circuitized substrate and said second circuitized substrate, electrically interconnecting selected ones of said electrical conductors of said first circuit with corresponding selected ones of said electrical conductors of said second circuit and at least one electrical component positioned substantially within said interposer; and said interposer further comprising a second electrical component and a heat dissipation component comprising a cooling body having a plurality of channels therein and cooling fluid therewithin, said heat dissipation component being positioned relative to said second electrical component for transferring heat generated thereby externally of said electronic package; said first and second circuitized substrates further having openings to accommodate at least one of the group consisting of said second electrical component and said heat dissipation component of said interposer.

2. The electronic package of claim 1, further comprising at least one additional electrical component also positioned substantially within said interposer.

3. The electronic package of claim 1, further comprising at least one second electrical component positioned on said second circuitized substrate and electrically coupled to selected ones of said plurality of electrical conductors of said second circuit.

4. The electronic package of claim 1, wherein said interposer comprises at least one dielectric layer having first and second opposing surfaces and a plurality of conductive members located substantially within said at least one dielectric layer, selected ones of said conductive members electrically interconnecting said selected ones of said electrical conductors of said first circuit with said corresponding selected ones of said electrical conductors of said second circuit.

5. The electronic package of claim 4, wherein selected ones of said plurality of conductive members located substantially within said at least one dielectric layer comprises mechanical spring members.

6. The electronic package of claim 5, wherein said plurality of electrical conductors of said first and second circuits comprise conductive pad members, said mechanical springs engaging respective pairs of said selected ones of said conductive pad members to form a separable connection therewith.

7. The electronic package of claim 1, further comprising at least one second electrical component positioned on said second circuitized substrate and electrically coupled to selected ones of said plurality of electrical conductors of said second circuit, and at least one third electrical component positioned on said first circuitized substrate and electrically coupled to selected ones of said plurality of electrical conductors of said first circuit.

8. A method of making an electronic package, said method comprising: providing a first circuitized substrate comprising an upper surface; forming a first circuit on said upper surface having a plurality of electrical conductors; connecting at least a first electrical component to said first circuitized substrate; providing a second circuitized substrate comprising a lower surface; forming a second circuit on said lower surface having a plurality of electrical conductors; connecting at least a second electrical component to said second circuitized substrate; providing an interposer including at least one opening to accommodate a first electrical component of at least one of the group: said first circuitized substrate and said second circuitized substrate, and a heat dissipation component comprising a cooling body having a plurality of channels therein, said method further comprising passing cooling fluid through said plurality of channels, said heat dissipation component positioned relative to at least one of said electrical components for transferring heat generated thereby; positioning said interposer substantially between said first and second circuitized substrates, said interposer electrically interconnecting selected ones of said electrical conductors of said first circuit with corresponding selected ones of said electrical conductors of said second circuit in a separable manner; and said heat dissipation component transferring said heat generated by said first electrical component externally of said electronic package when said interposer is positioned substantially between said first and second circuitized substrates; and said interposer further comprising at least a second component and second heat dissipation component positioned relative thereto for transferring heat generated thereby externally of said electronic package; said first and second circuitized substrates further having openings to said second electrical component and said heat dissipation component of said interposer.

9. The method of claim 8, further comprising positioning at least one additional electrical component substantially within said interposer.

10. The method of claim 8, further comprising positioning at least one second electrical component positioned on said second circuitized substrate and electrically coupling said at least one second electrical component to selected ones of said plurality of electrical conductors of said second circuit.

11. The method of claim 8, wherein said interposer comprises at least one dielectric layer having first and second opposing surfaces, said method further comprising forming a plurality of conductive members substantially within said at least one dielectric layer, said selected ones of said conductive members electrically interconnecting said selected ones of said electrical conductors of said first circuit with said corresponding selected ones of said electrical conductors of said second circuit when said interposer is positioned substantially between said first and second circuitized substrates.

12. The method of claim 8, further comprising positioning at least one second electrical component on said second circuitized substrate and electrically coupling said at least one second electrical component to said selected ones of said plurality of electrical conductors of said second circuit, and further positioning at least one third electrical component on said first circuitized substrate and electrically coupling said at least one third electrical component to said selected ones of said plurality of electrical conductors of said first circuit.

13. An electronic package comprising: a first circuitized substrate having an upper surface including at least a first electrical component and a first circuit thereon having a plurality of electrical conductors; a second circuitized substrate having a lower surface including at least a second electrical component and having a second circuit thereon including a plurality of electrical conductors; an interposer comprising at least one dielectric layer having first and second opposing surfaces and a plurality of conductive members located substantially within said at least one dielectric layer, selected ones of said conductive members electrically interconnecting said selected ones of said electrical conductors of said first circuit with said corresponding selected ones of said electrical conductors of said second circuit, and wherein selected ones of said plurality of conductive members located substantially within said at least one dielectric layer comprises mechanical spring members, said interposer positioned substantially between said first and second circuitized substrates and comprising at least one opening to accommodate electrical components of at least one of the group: said first circuitized substrate and said second circuitized substrate, electrically interconnecting selected ones of said electrical conductors of said first circuit with corresponding selected ones of said electrical conductors of said second circuit and at least one electrical component positioned substantially within said interposer; and said interposer further comprising a heat dissipation component positioned relative to said at least one electrical component for transferring heat generated thereby externally of said electronic package.

14. The electronic package of claim 13, further comprising at least one additional electrical component also positioned substantially within said interposer.

15. The electronic package of claim 13, further comprising at least one second electrical component positioned on said second circuitized substrate and electrically coupled to selected ones of said plurality of electrical conductors of said second circuit.

16. The electronic package of claim 13, wherein said interposer comprises at least one dielectric layer having first and second opposing surfaces and a plurality of conductive members located substantially within said at least one dielectric layer, selected ones of said conductive members electrically interconnecting said selected ones of said electrical conductors of said first circuit with said corresponding selected ones of said electrical conductors of said second circuit.

17. The electronic package of claim 13, further comprising at least one second electrical component positioned on said second circuitized substrate and electrically coupled to selected ones of said plurality of electrical conductors of said second circuit, and at least one third electrical component positioned on said first circuitized substrate and electrically coupled to selected ones of said plurality of electrical conductors of said first circuit.

18. A method of making an electronic package, said method comprising: providing a first circuitized substrate comprising an upper surface; forming a first circuit on said upper surface having a plurality of electrical conductors; connecting at least a first electrical component to said first circuitized substrate; providing a second circuitized substrate comprising a lower surface; forming a second circuit on said lower surface having a plurality of electrical conductors; connecting at least a second electrical component to said second circuitized substrate; providing an interposer comprising at least one dielectric layer having first and second opposing surfaces and a plurality of conductive members located substantially within said at least one dielectric layer, selected ones of said conductive members electrically interconnecting said selected ones of said electrical conductors of said first circuit with said corresponding selected ones of said electrical conductors of said second circuit, and wherein selected ones of said plurality of conductive members located substantially within said at least one dielectric layer comprises mechanical spring members, said interposer including at least one electrical component positioned substantially therein and further comprising at least one opening to accommodate electrical components of at least one of the group: said first circuitized substrate and said second circuitized substrate, and a heat dissipation component positioned relative to at least one of said electrical components for transferring heat generated thereby; positioning said interposer substantially between said first and second circuitized substrates, said interposer electrically interconnecting selected ones of said electrical conductors of said first circuit with corresponding selected ones of said electrical conductors of said second circuit in a separable manner; and said heat dissipation component transferring said heat generated thereby externally of said electronic package when said interposer is positioned substantially between said first and second circuitized substrates.

19. The method of claim 18, further comprising positioning at least one additional electrical component substantially within said interposer.

20. The method of claim 18, further comprising positioning at least one second electrical component positioned on said second circuitized substrate and electrically coupling said at least one second electrical component to selected ones of said plurality of electrical conductors of said second circuit.

21. The method of claim 18, wherein said interposer comprises at least one dielectric layer having first and second opposing surfaces, said method further comprising forming a plurality of conductive members substantially within said at least one dielectric layer, said selected ones of said conductive members electrically interconnecting said selected ones of said electrical conductors of said first circuit with said corresponding selected ones of said electrical conductors of said second circuit when said interposer is positioned substantially between said first and second circuitized substrates.

22. The method of claim 18, further comprising positioning at least one second electrical component on said second circuitized substrate and electrically coupling said at least one second electrical component to said selected ones of said plurality of electrical conductors of said second circuit, and further positioning at least one third electrical component on said first circuitized substrate and electrically coupling said at least one third electrical component to said selected ones of said plurality of electrical conductors of said first circuit.

* * * * *